(12) United States Patent
Kamat

(10) Patent No.: US 7,337,421 B2
(45) Date of Patent: Feb. 26, 2008

(54) METHOD AND SYSTEM FOR MANAGING DESIGN CORRECTIONS FOR OPTICAL AND PROCESS EFFECTS BASED ON FEATURE TOLERANCES

(75) Inventor: Vishnu Govind Kamat, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 325 days.

(21) Appl. No.: 10/955,527

(22) Filed: Sep. 30, 2004

(65) Prior Publication Data

US 2006/0075379 A1 Apr. 6, 2006

(51) Int. Cl.
G06F 17/50 (2006.01)

(52) U.S. Cl. ....................................................... 716/10
(58) Field of Classification Search .................... 716/10
See application file for complete search history.

(56) References Cited

U.S. PATENT DOCUMENTS

| | | | |
|---|---|---|---|
| 5,497,334 A * | 3/1996 | Russell et al. ................. | 716/5 |
| 6,249,904 B1 | 6/2001 | Cobb | |
| 6,301,697 B1 | 10/2001 | Cobb | |
| 6,370,679 B1 | 4/2002 | Chang et al. | |
| 6,425,113 B1 * | 7/2002 | Anderson et al. ............... | 716/5 |
| 6,453,452 B1 * | 9/2002 | Chang et al. ................... | 716/8 |
| 6,467,076 B1 | 10/2002 | Cobb | |
| 6,505,327 B2 | 1/2003 | Lin | |
| 6,560,766 B2 | 5/2003 | Pierrat et al. | |
| 2002/0199157 A1 | 12/2002 | Cobb | |

OTHER PUBLICATIONS

Rieger, Michael L. et al., "OPC strategies to minimize mask cost and writing time," 21st annual BACUS Symposium on Photomask Technology, Proceedings of SPIE vol. 4562, pp. 154-160, 2002.

Rieger, Michael L, et al, "Anticipating and controlling mask costs within EDA physical design," Proceedings of SPIE, vol. 5130, pp. 617-627, 2003.

* cited by examiner

Primary Examiner—Jack Chiang
Assistant Examiner—Brandon Bowers
(74) Attorney, Agent, or Firm—Sheppard Mullin Richter & Hampton LLP

(57) ABSTRACT

A method for modifying instances of a repeating pattern in an integrated circuit design to correct for perturbations during rendering is described. In the typical embodiment, these corrections are optical proximity corrections that correct for optical effects during the projection of the mask pattern onto the wafer and/or processing effects for example photoresist response and etching effects. The method comprises determining a correction for the repeating pattern based on a first set of tolerances for features of the repeating pattern. Then, the suitability of the corrections is evaluated for instances of the repeating pattern in the integrated circuit design based on a second set of tolerances, which is different from the first set of tolerances. This can be used to preserve much of the hierarchy of the layout data in the corrected, or lithography, data. This can be achieved during the OPC process, thus avoiding the post OPC compaction. It can further take advantage of the fact that, for a given physical layer of a chip for example, different portions of the representing design polygons typically have different requirements on pattern fidelity on the wafer while perturbations may vary as a function of field position. By applying knowledge of the feature tolerances, and allowing design corrections only when tolerances are not met, the data explosion that occurs when moving from layout to lithography data can be contained without sacrificing accuracy.

52 Claims, 9 Drawing Sheets

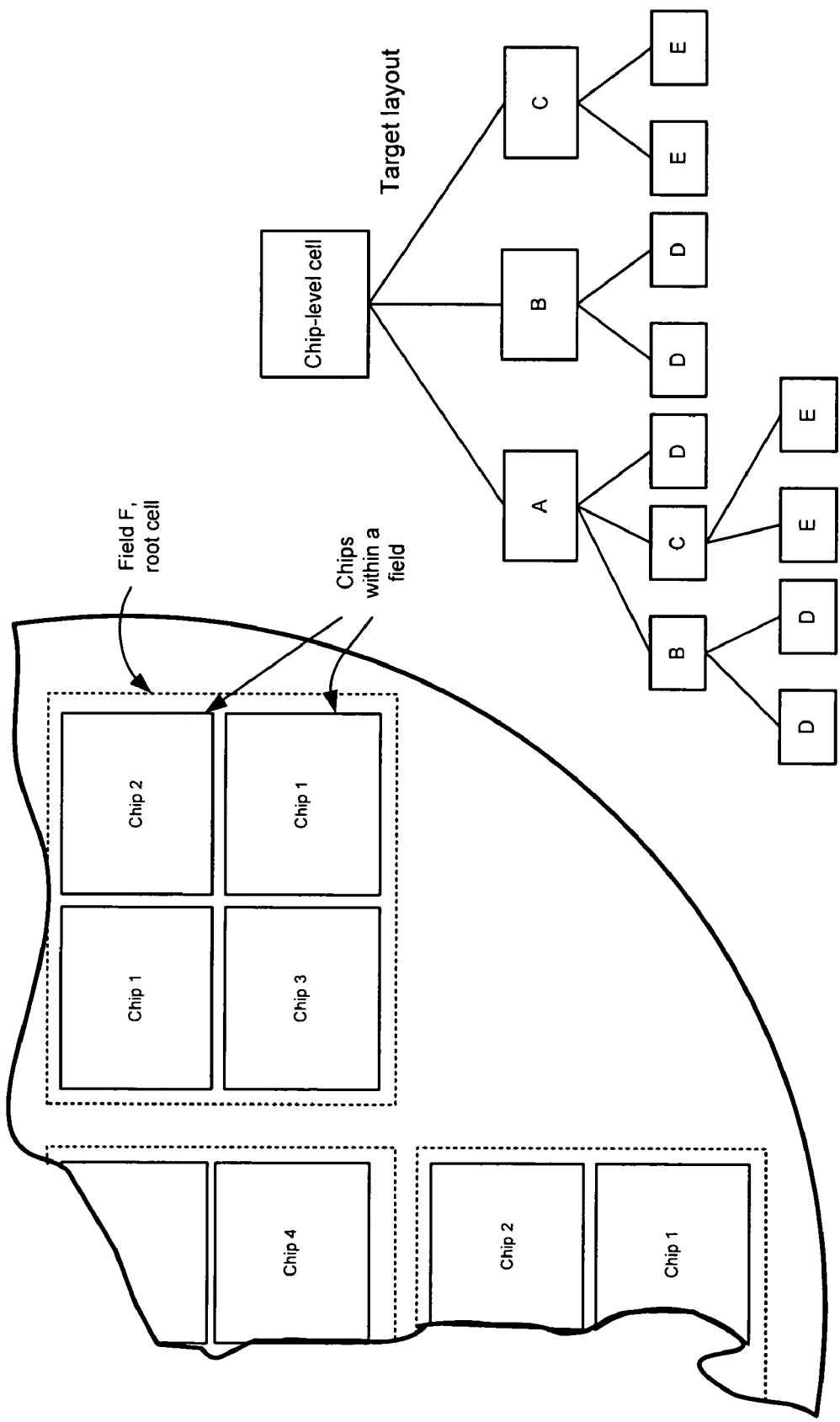

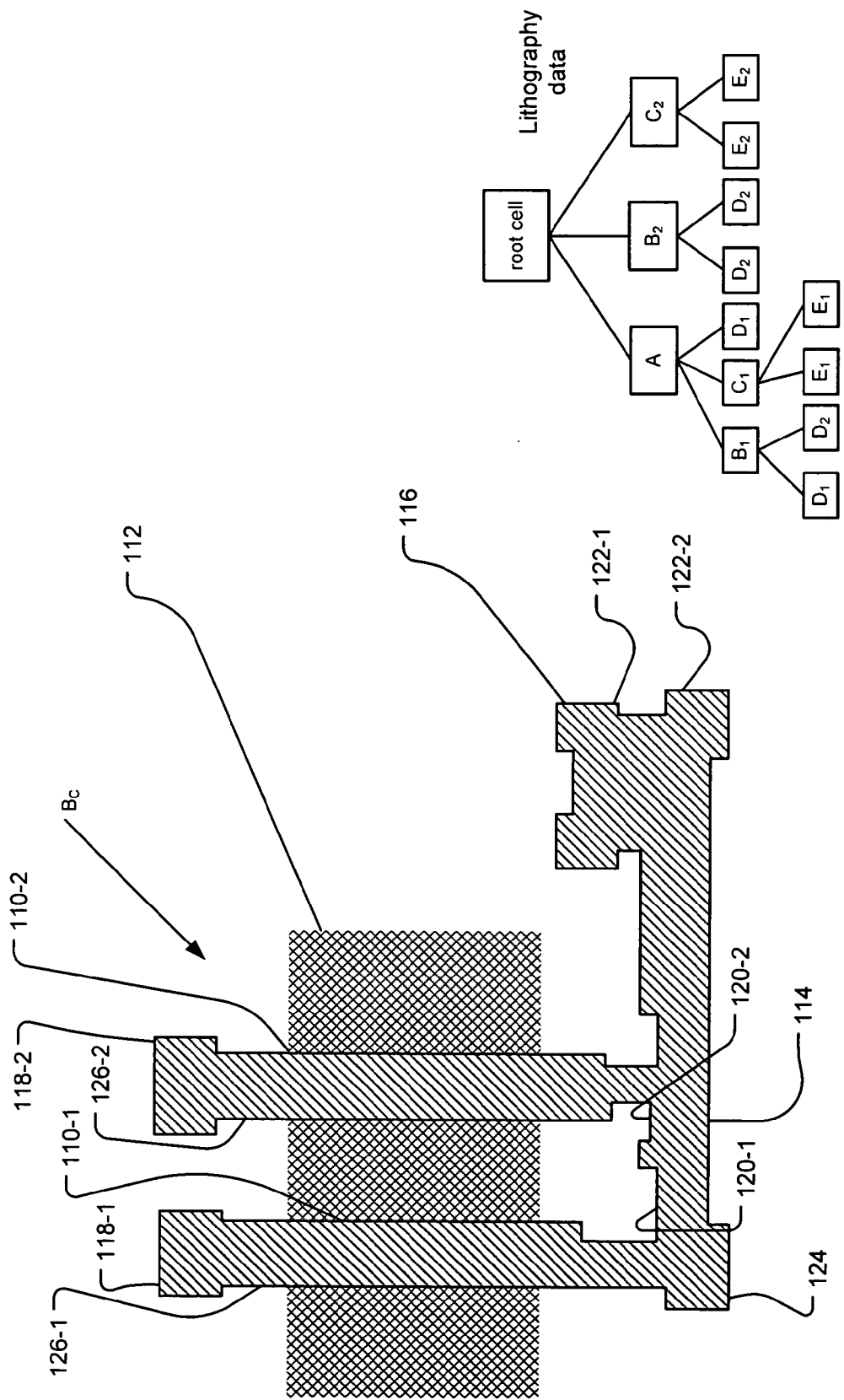

METHOD AND SYSTEM FOR MANAGING DESIGN CORRECTIONS FOR OPTICAL AND PROCESS EFFECTS BASED ON FEATURE TOLERANCES

BACKGROUND OF THE INVENTION

The process of fabricating integrated circuits typically involves a functional design step, followed by a physical design step. During the functional design step, a design concept is described using a hardware description language and is then converted into a netlist, which specifies the electronic components and the connections between the components. The physical design step specifies the placement of the electrical components or elements on the chip and routing of the connections between the electrical components thereby implementing the netlist. The physical design process generates the physical design data, which are synonymously called layout data, layout, or target layout.

The target layout defines a set of binary patterns or objects, which are also called "features" or "geometric features". Usually the objects are represented as a polygon or collection of polygons in the layout data in order to facilitate the specification of the objects.

Each object can be a part of an electronic component such as a gate of a transistor or a connection between components. Each polygon object has vertices and edges joining the vertices. Each vertex is usually defined by its coordinates in a Cartesian x-y coordinate system. In a typical very-large scale integrated (VLSI) circuit, most edges are parallel to the x or y axis.

Often the physical design data are stored and transmitted in a machine-readable format such as GDSII format, OASIS™ format, or in a database such as OpenAccess database technology or Milkyway™ design database. See, for example, *OpenAccess: The Standard API for Rapid EDA Tool Integration*, 2003 by Si2, Inc; Milkyway Foundation Database for Nanometer Design, Synopsys, Inc. 2003.

In these formats or databases, the layouts are often described hierarchically. This has the advantage of reducing file sizes and improving efficiency for certain changes, since some patterns are placed multiple times in the layout. Repeatedly describing the same structure in detail can thus be avoided.

In the layout hierarchy, a cell is a subset of the layout pattern that can be referenced as a whole object. Thus, cells can be included in the layout by reference. Inclusions by reference can further be nested.

Often, the hierarchy of the layout resembles a tree. The leaves of a tree are attached to its branches. Branches are attached to larger branches. The hierarchy of branches continues until the trunk of the tree reaches its roots. Leaf cells of a circuit are cells that do not include any cells by reference. A leaf cell comprises a set of objects, which are usually polygons. A child cell is included in its parent cell. A root cell it is not included in any other. A layout can have multiple root cells resembling a forest with multiple trees. And cells can be referenced a number of times within a single parent cell or by multiple parent cells.

Multiple instances of a cell can be described by a structure reference or an array reference. A structure reference places an instance (a copy) of a cell at a particular (x,y)-offset within a parent cell. Each instance has transformation information, which can often include translation, magnification, reflection, and/or rotation. An array reference describes multiple instances of a cell that are placed on a set of locations that form a grid or array. The array is defined by: 1) a number of rows; 2) a number of columns, 3) row and column spacings, 4) (x,y) offset of an instance; and 5) a set of magnifications, reflections, and rotations that are common to all cells in the array.

If a layout does not have hierarchy, it is called flat. A layout can be flat as per design. Sometimes a hierarchical layout can be flattened. Flattening a layout means removing its hierarchical organization by replacing each cell reference by the set of polygons contained in the cell that is referenced.

Semiconductor device manufacturing comprises many steps of patterning layers according to the layout data. A layer is either the substrate of the semiconductor wafer or a film deposited on the wafer. At some steps, a pattern is etched into a layer. At some other steps, ions are implanted, usually in a pattern, into the layer. Generally, patterning comprises: lithography, and etch or implant.

The prevalent form of lithography is optical projection lithography. This involves first making a mask or reticle that embodies the pattern to be projected onto the wafer. An image of the mask's pattern is then optically projected onto a photoresist film coated on the wafer. This selectively exposes photoresist. The latent image is then developed, thereby making a stencil on the wafer.

Presently, the most common optical lithography projectors are stepper-scanners. These instruments expose a slit shaped region, which is often 26 millimeters (mm)×8 mm on the wafer. The wafer is scanned under the slit by a motorized stage under interferometer control. The mask is scanned in synchronization with the wafer but at a higher speed to account for the reduction of the projector (typically 4×). One scan typically exposes a 26 mm×33 mm image field. Step-and-repeat lithography projectors expose the wafer a field at a time. A common field size here is 22 mm×22 mm. In either case, many exposure fields are needed to cover the wafer.

Other forms of lithography include: mask-less optical projection lithography where the mask is replaced by a spatial light modulator. The spatial modulator is typically an array of micro-machined mirrors that are illuminated and imaged onto the wafer. The spatial light modulator is driven by the lithography data. Direct electron-beam writing lithography; electron projection lithography, and imprint lithography are other forms of lithography.

Modern semiconductor lithography processes often print features that are smaller than the exposure wavelength. In this regime, which is called the low-$k_1$ regime, the field and wave nature of light is prevalent, and the finite aperture of the projection lens acts as a low-pass filter of spatial frequencies in the image. Thus, it may be difficult for the projection lens to reproduce the high spatial frequency components required to reproduce the sharp edges or corners in polygon objects for example. Also, light entering a mask opening from one object may impact another shape in close proximity, leading to a complex interaction of the electric fields of adjacent objects. Thus, the final shapes that are produced on the wafer will often have rounded corners and may bulge towards adjacent objects in ways that can impact the process yield. This resulting image distortion, called optical proximity effect, is responsible for the most significant distortion that arises in the transfer of the mask pattern onto the wafer.

Another source distortion is resist process effects. Diffusion and loading effects during resist and etch processing impact the fidelity with which a pattern can be rendered or transferred to the wafer.

Optical Proximity Correction (OPC) is the process of changing, or pre-distorting, the target layout data to produce lithography data so that the pattern that is etched in the wafer is a closer replica of the target layout. The goal of OPC is to counter the distortions caused by the physical patterning process (see A. K-T Wong, Resolution enhancement techniques in optical lithography, SPIE Press, Vol. TT47, Bellingham, Wash., 2001; H. J. Levinson, Principles of Lithography, SPIE Press, Bellingham, Wash., 2001). In effect, the objects or polygons of the lithograph data are modifications from those specified by the target layout in an effort to improve the reproduction of the critical geometry. This is often accomplished by moving object edges and by adding additional objects to the layout to counter optical and process distortions. These corrections are required to ensure the intended target design pattern fidelity is met improving the process window and consequently manufacturing yield.

Application of many resolution enhancement technologies (RET) can also have the effect of changing the layout data relative to the lithography data. RET also addresses distortion in the lithography process by pre-compensation. Typically, RET involves implementing a resolution enhancement technique like insertion of sub-resolution assist features (SRAF), phase shift enhancement using an attenuated phase mask, or designing a mask such that includes quartz etching to introduce phase shifting across features.

In short, the target layout describes the pattern that the designer desires to render on the wafer to form the integrated circuit. It is usually different than the pattern that is actually rendered on the integrated circuit, and is therefore usually very different than the pattern submitted to the mask making process due to implementations of RET and OPC. Thus, the target layout, the lithography or mask data, and the pattern resulting on the wafer are distinct patterns.

Different techniques are used to simulate the transformation between the mask pattern and the pattern that is formed in the photo resist. The process for generating the OPC, RET, and other compensations for a given object or mask is typically an iterative process involving moving or adding to the objects, performing a fast simulation to determine if the new objects result in a better resist pattern. In model-based OPC or RET, various process effects are simulated. Model-based OPC, for example, is a numerically intensive calculation that transforms the target layout into mask data.

One issue is how the OPC, RET, and/or process corrections should be applied to repeating patterns such as instances of a cell in a hierarchical pattern description, such as in a structure reference or an array reference. The distortions usually have an environment and position dependence across the field of the mask. As a result, repeating patterns should receive distinct corrections for changes in the environment and position.

Typically, corrections are performed once on a repeating pattern and these corrections are propagated across all references or placements of the same pattern. To accommodate for field position dependent corrections, each of these placements needs to be further corrected to achieve the targeted feature fidelity on the wafer.

Thus, small differences are possible across different placements of the repeating patterns. However a result of this correction approach is that the lithography data are severely flattened relative to the layout data since different instantiations for the same repeating pattern from the target layout are required in the lithography data. As a result large amounts of data are generated to represent the design corrections resulting in a larger lithography data output database.

Others have proposed solutions to this problem. For example, some seek to retain the original hierarchy after OPC by restoring the results of the OPC to the original hierarchy of the design or with some modifications to accommodate interactions between parent and child of neighboring cells. In other cases, if the environment is different for a given cell, a new instance is created a priori. The output hierarchy is a collection of all instances that are distinguished by their interaction with the environment. Still others have proposed post OPC compaction allowing the corrections of identical patterns to be the same if the tolerance is met for differences in environment.

SUMMARY OF THE INVENTION

The present invention concerns the preservation of much of the hierarchy of the layout data in the optical proximity corrected, or lithography, data. This can be achieved during the OPC, RET, or process correction process, thus avoiding the post correction compaction. It can further take advantage of the fact that, for a given physical layer of a chip for example, different portions of the representing design polygons typically have different requirements on pattern fidelity on the wafer while perturbations may vary as a function of field position. By applying knowledge of the feature tolerances, and allowing design corrections only when tolerances are not met, the data explosion that occurs when moving from layout to lithography data can be contained without sacrificing accuracy in a way that will affect yield. In short, this invention comprehends a method and system to correct the layout data taking into account the feature tolerances of the integrated circuit design.

In general, according to one aspect, the invention features a method for modifying instances of a repeating pattern in an integrated circuit design to correct for perturbations during rendering.

In the typical embodiment, these corrections are optical proximity corrections that correct for optical effects during the projection of the mask pattern onto the wafer and/or processing effects that affect how the pattern of the photoresist, for example, is transferred into the wafer or layer on the wafer. RET corrections can further be included to address efforts to improve the resolution of the rendering process to counter perturbations due to the wave nature of light.

The method comprises determining a correction for the repeating pattern based on a first set of tolerances for features of the repeating pattern. Then, the suitability of the corrections is evaluated for instances of the repeating pattern in the integrated circuit design based on a second set of tolerances, which is different from the first set of tolerances.

In the typical embodiment, the first set of tolerances is a relatively tight set of tolerances that is determined in order to maximize the ability of the repeating pattern's corrections to be propagated across the field and wafer in view of position dependent perturbations such as due to proximity effects, lens aberrations, optical flare and process effects. The second set of tolerances is usually a tolerance set that describes the requirement for the repeating pattern at the particular instance or placement in the field. By satisfying this second set of tolerances, it is assured that the design requirements of the integrated circuit design can be met.

In one embodiment, the correction of the instances of the repeating pattern is applied if the correction is deemed suitable to thereby create a first set of corrected instances of the repeating pattern. However, if the correction is deemed unsuitable, a different set of corrections are applied to the instance of the repeating pattern to thereby create a second set of corrected instances of the repeating pattern. This has a result of flattening the design to some degree. However, the flattening is kept to the minimum required to meet the design constraints.

In one implementation, the correction comprises determining changes to the repeating pattern in order to compensate for optical distortions or process distortions during rendering or add RET modifications. The first set of tolerances is determined to improve a likelihood that tolerances will be met for other instances of the repeating pattern; whereas the second set of tolerances is determined based on a variation of dimensions of features to a maximum variation due to proximity effects, for example.

Often, to ensure the suitability of the propagated corrections across different instances of the template core, they are classified based on a deviation in the immediate environment of the instances. The environment can be defined to include one to two pitches of the actual layout. This typically translates to a distance of a few hundred nanometers to 20 micrometers from the repeating pattern. In other applications, however, the environment further includes the entire diffraction radius of influence. In addition, the suitability of the correction can be assessed based on the expected deviation in pattern perturbations based on the field position to address field position dependent effects such as lens flare or aberration and pupil illumination non-uniformities. Distortions are also introduced by the mask exposure and post exposure processes. These include but are not limited to proximity effects, fogging and mask etch loading.

In the preferred embodiment, a model based correction method is used where in the model represents the process and optical behavior of the mask and wafer manufacturing and the imaging system and can predict the distortions in the wafer results to estimate the appropriate design correction.

In general, according to another aspect, the invention features a method for modifying instances of a repeating pattern in an integrated circuit design to correct for perturbations during rendering. The method comprises determining a correction for the repeating pattern and then evaluating a suitability of the correction for instances of the repeating pattern in the integrated circuit design based on a set of tolerances.

The corrections are applied to the instances of the repeating pattern if deemed suitable to thereby create a first set of corrected instances of the repeating pattern. However, if the corrections are deemed unsuitable, a different correction is applied to the instances of the repeating pattern to thereby create a second set of corrected instances of the repeating pattern.

The advantage of this method is that the layout flattening is controlled during the OPC process. At each instance, the suitability of the corrections is determined, and if the corrections are deemed unsuitable, new instances are created, as necessary. This avoids the requirement for post OPC compaction and trying to rebuild the hierarchy after OPC has been performed for the entire design.

In general, according to another aspect, the invention also features a computer software product for applying corrections to an integrated circuit design to compensate for perturbations occurring from the rendering of the integrated circuit design. The product comprises a computer readable medium, such as a disk or other medium for transferring program instructions. The program instructions are stored and when read by a computer cause the computer to determine a correction for a repeating pattern in an integrated circuit design based on a first set of tolerances for features of the repeating pattern. Then, the suitability of the corrections is evaluated for instances of the repeating pattern in the integrated circuit design. This suitability evaluation is based on a second set of tolerances, which is different from the first set of tolerances.

In general, according to still another aspect, the invention features a system for modifying instances of a repeating pattern in an integrated circuit design. This system comprises a data store, such as a disk or disk array that stores the integrated circuit design. A compute resource is further provided. This can be a workstation, computer, and/or multi-/parallel processing machine that determines a correction for the repeating pattern based on a first set of tolerances for features of the repeating pattern. It then evaluates a suitability of the correction for instances of the repeating pattern in the integrated circuit design based on a second set of tolerances, which is different from the first set of tolerances.

In general, according to still another aspect, the invention features a system for modifying instances of a repeating pattern in an integrated circuit design. The system comprises a data store for storing the integrated circuit design and a compute resource that determines a correction for the repeating pattern and then evaluates a suitability of the correction for instances of the repeating pattern in the integrated circuit design based on a set of tolerances. The correction is applied to the instances of the repeating pattern if the correction is deemed suitable to thereby create a first set of corrected instances of the repeating pattern. However, if the correction is deemed unsuitable, a difference correction is applied to the instances of the repeating pattern to thereby create a second set of corrected instances of the repeating pattern.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 1 is a schematic diagram illustrating an integrated circuit design as rendered on a wafer;

FIG. 2 schematically illustrates the hierarchy of the target layout data specifying the integrated circuit design.

FIG. 4 illustrates a corrected version of the cell or repeating pattern of the integrated circuit design;

FIG. 5 illustrates the hierarchy of the lithography data after its transformation from the layout data;

DETAILED DESCRIPTION OF THE PREFERRED EMBODIMENTS

FIG. 1 illustrates the schematic arrangement of multiple chips within a field and the multiple exposures of the field across a wafer.

Specifically, in the design, the root cell often exists at the level of the chip or field F. Within the field there may be multiple placements of chips or functional structures within chips such as chip-level cells Chip 1, Chip 2, Chip 3. Within each of these child cells Chip 1, Chip 2, Chip 3 are repeating patterns. These repeating patterns are often repeated many times within each chip Chip 1, Chip 2, Chip 3 at different coordinates. The patterns are often also rotated, reflected, and possibly scaled at each placement. In one case, the repeating patterns are consolidated across the field for a field wide correction based on tolerances. In another aspect, corrections are incorporated within a single chip based on field position and propagated to other chips within the field, which contain the same repeating patterns and their suitability verified and modifications appropriately incorporated as described in this invention. This approach of template core generation and consolidation across the chip is generally described in U.S. Pat. Appl. No. 10/955,067, entitled Method and System for Semiconductor Design Hierarchy Analysis and Transformation, by Vishnu Govind Kamat, filed on an even date herewith, which application being incorporated herein in its entirety by this reference.

FIG. 2 illustrates the organization of the layout data of an exemplary circuit design for a chip. Specifically, the layout data are often organized in a hierarchy in which a root cell, for example, is provided. This root cell A may reference one or more chip or unit level cells A, B, C. Each of these child cells A, B, C in turn references their own repeating patterns D, E, which can also be other chip level cells, see B, C.

In the example, repeating patterns D and E are distributed within the chip instances A, B, C. Further, it is also possible that cell A reference similar level cells such as B and C.

Figure 3:
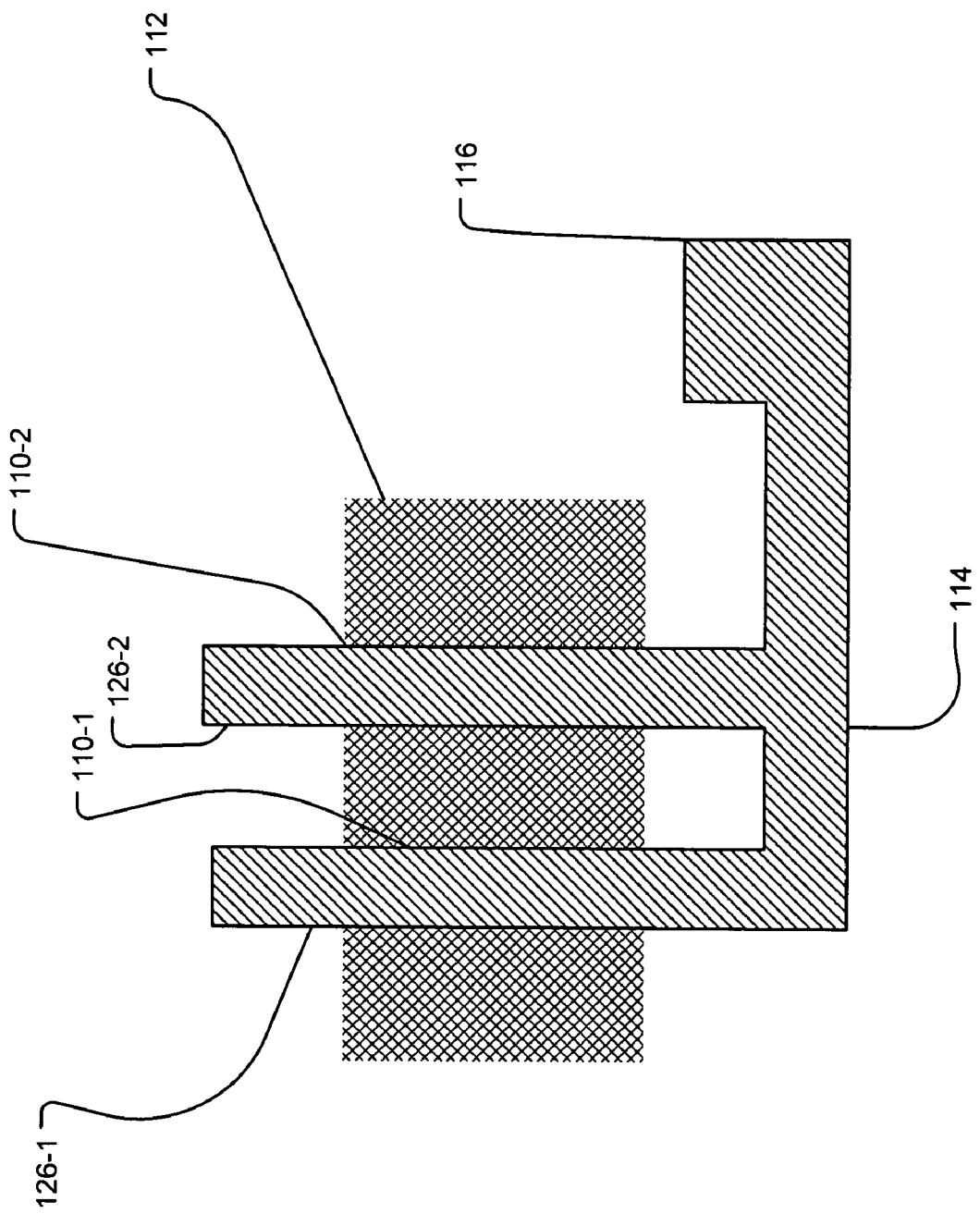
FIG. 3 illustrates an exemplary cell or repeating pattern within the integrated circuit design.

FIG. 3 illustrates an exemplary repeating pattern. In the illustrated embodiment, the repeating pattern at this layer in the hierarchy is referred to as a template core. Often, these are repeating structures within a chip that perform a common function such as bit level cells within the array of a memory chip. These template core repeating patterns have specific tight tolerances owing to their required functionality. They are often repeated a large number of times within each chip level cell.

It is not common that a polysilicon layer is decomposed into gate, interconnect polysilicon, and landing pad regions into different cells. For example, in the illustrated embodiment, gate regions 110-1, 110-2, are located relative to an active region 112. Further, interconnect polysilicon traces 114 connect the gate regions to a landing pad 116 in the illustrated example.

This template core must be corrected to compensate for optical proximity and process related perturbations by applying an optical proximity correction.

FIG. 4 illustrates an exemplary corrected template core $B_c$. Specifically, hammerhead line end corrections 118-1, 118-2, have been added to the polysilicon traces 126-1, 126-2 extending from the gates 110-1, 110-2. Further, serif corner corrections 120-1, 120-2 have been added to the polysilicon trace 114 at the concave corners. Further, an additive serif 124 has been further provided to prevent rounding of an outside, also called convex, corner. Additive serifs 122-1 and 122-2 have also been added to improve the fidelity to which the landing pad 116 is reproduced.

FIG. 5 illustrates the hierarchy of the corrected, lithography data. Specifically, a root level cell references the chip level cells A, B, C. In the example, different corrected versions of cell B and C are present, being identified as corrected cells $B_{1\ and\ B2}$ and $C_1$ and $C_2$. Similarly, corrected versions of cells D and E are present, being identified as corrected cells $D_1$ and $D_2$ and $E_1$ and $E_2$, respectively.

A problem arises, however, if these corrections are propagated across the entire field and to the different instances of the template core level repeating patterns. The effect of various perturbations is field and environment dependent. As a result, some distinct corrections may be required in order to maintain the required tolerances across the field or meet different tolerances for the various instances of the repeating pattern, template core level cells.

Figure 6:
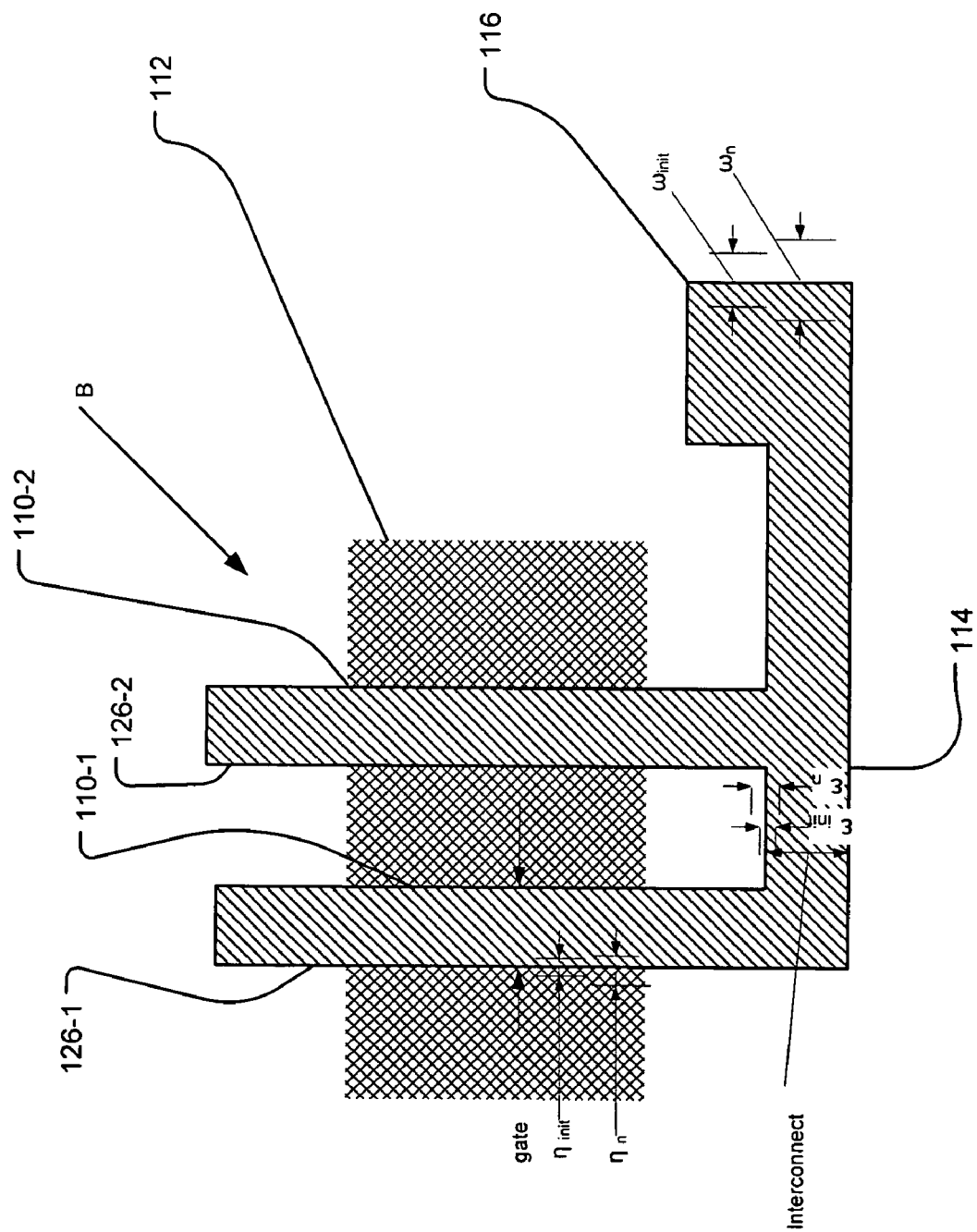
FIG. 6 illustrates the tolerances or critical dimensions associated with the exemplary cell or repeating pattern of the integrated circuit design illustrating the initial tolerances (init) and the subsequent instance-specific tolerances (n) according to the present invention.

FIG. 6 illustrates various tolerances associated with the template core repeating pattern B. Specifically, two sets of tolerances are defined according to the invention: an initial, propagating tolerance, init, and tolerances associated with the various instances of the repeating pattern B, n.

For example, the gate width may be a critical dimension in which the variation in the dimension is indicated by ±η. The interconnect critical dimension is further important but a certain deviation of ±ε, is acceptable for the design. Finally, the increased dimensional tolerances may be associated with the landing pad 116 such that as indicated by ±ω.

According to the invention, a first set of tolerances are associated with each of these features. $\eta_{init}$, $\epsilon_{init}$ and $\omega_{init}$. These initial or propagating tolerances are usually defined by reference to the tightest set forth for the repeating pattern in its various instantiations across and throughout the field A. It is usually a collection of the tightest feature tolerances for the various instantiations of the template core repeating pattern B.

These initial tolerances are set to improve the likelihood that tolerances will be met for other instantiations of the repeating pattern regardless of field position or variation in surrounding features. Often, the initial or propagating tolerances are much tighter than corresponding tolerances associated with any specific instantiation n. Thus, $\eta_{init}$ is tighter than tolerance $\eta_n$ for instantiation n of the repeating pattern at some given location within the field. $\epsilon_{init}$ is tighter than $\epsilon_n$ and $\omega_{init}$ is tighter than tolerance $\omega_n$.

Figure 7A:
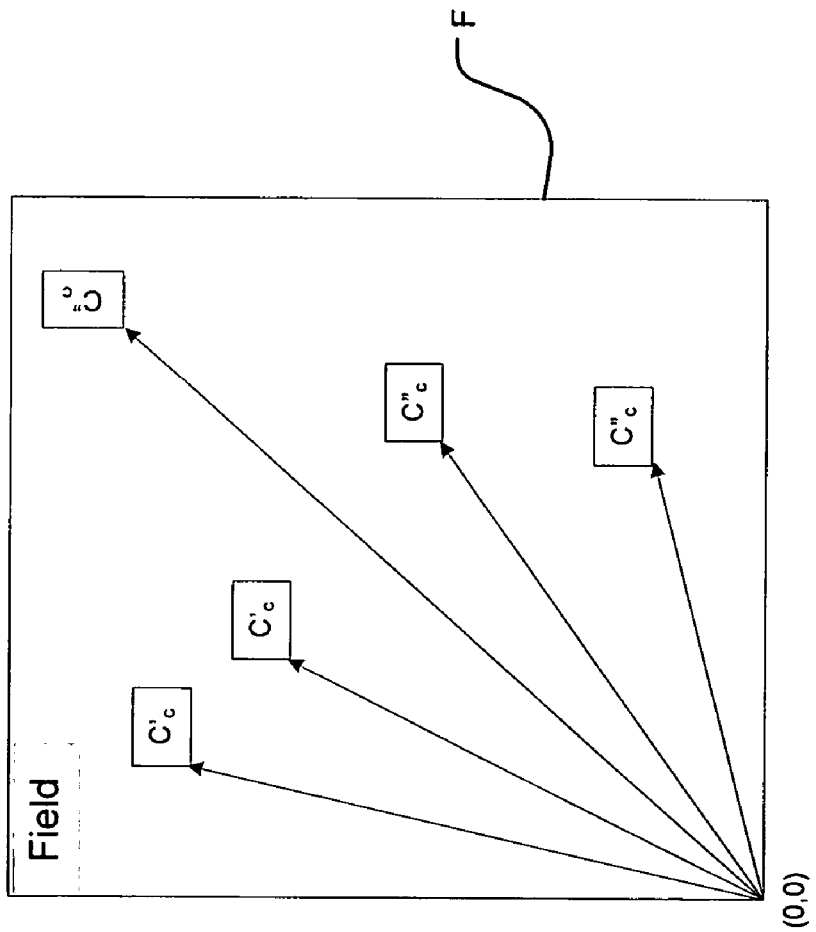
FIG. 7A illustrates the distribution of the corrected repeating pattern, template core, across the field according to the invention.

FIG. 7A illustrates the corresponding propagation of the corrections to the various instances of the repeating pattern C within the field F. It shows that as the template core repeating pattern C is distributed in the field, the suitability of the corrections of the template core is evaluated at each instantiation. At each case, it is determined whether or not the corrected template core will meet the tolerances associated with that instantiation and based on variation in that instantiation's surrounding environment. Some instances, the original corrected version $C_c'$ will be valid. However, where the corrections will not be suitable to meet the requirements of the integrated circuit design, further corrections to the base correction as illustrated in FIG. 5 may be required. This leads to the instantiation of a new version of the corrected template core $C''_c$.

Figure 7B:
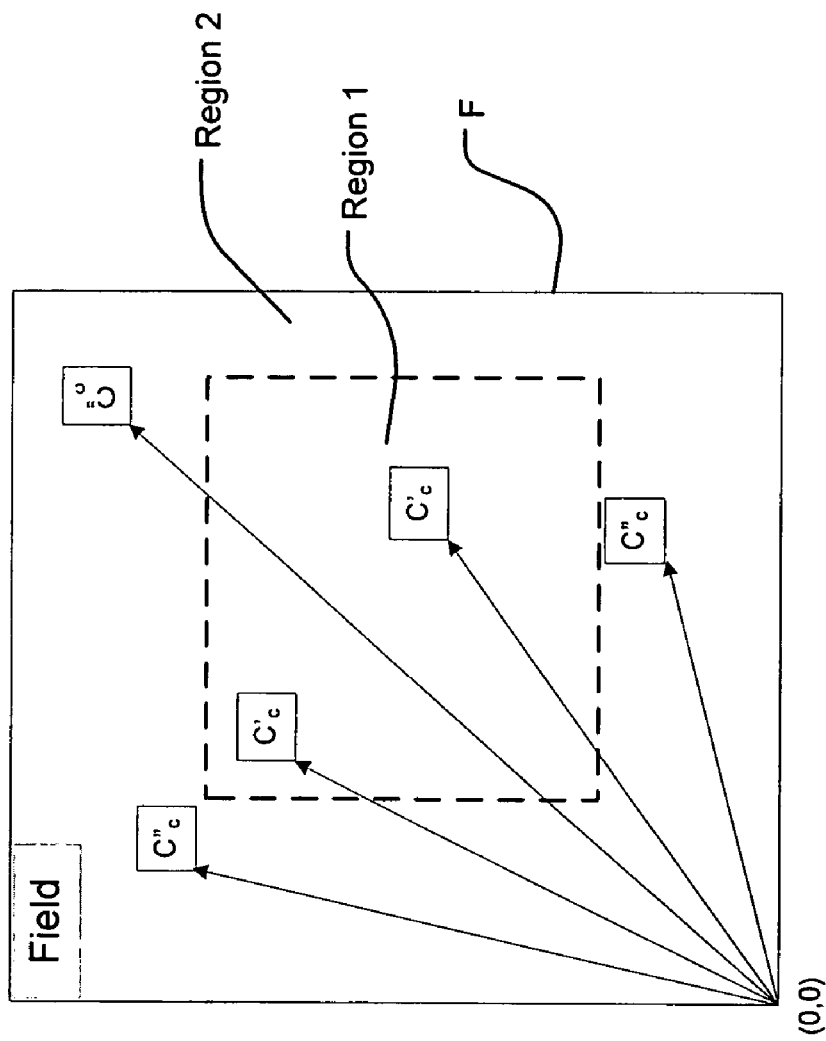
FIG. 7B illustrates the distribution of the corrected repeating pattern or template core across the field and specifically within zones of the field according to the present invention.

FIG. 7B illustrates another embodiment in which the corrected instantiations of the template core C are propagated to regions within the field F. Specifically, in region 1, better reproduction fidelity may be achievable due to reduced position and environmental induced perturbations. As a result, the original corrected versions of template core C' may be adequate for region 1. However, in the exterior region of the field region 2, further corrections may be required to the template core C leading to version C".

Figure 8:
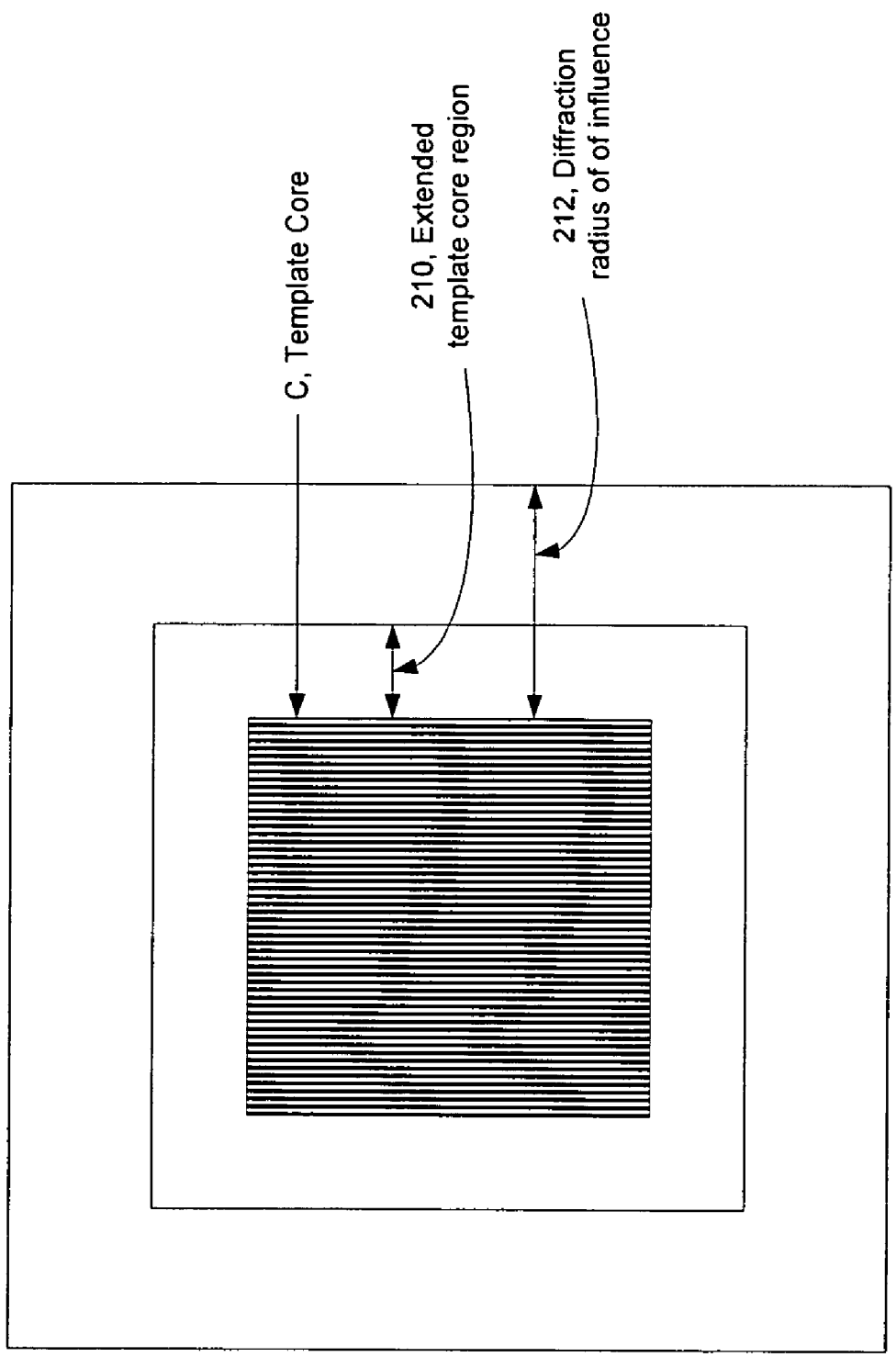
FIG. 8 illustrates the relationship between the repeating pattern or template core and the surrounding regions that may impact the rendering of the template core due to optical proximity or process effects.

FIG. 8 illustrates an alternative method for determining the suitability providing for a coarse level classification of the template core for the various instantiations based on the extended template core environment.

Specifically, within the template core C, for each instantiation of the template core C, variation may occur within an extended template core region 210 and further into the diffraction radius of influence 212. The various instantiations of the template cores C at locations within the field are affected by the nature of the surrounding designs.

As a result, one can define these template cores as a function of the environmental variation either within the extended template core region 210, corresponding to usually less than 4 design pitches and typically 1 to 2 design pitches, and further into the entire diffraction radius of influence 212. In these areas, design corrections vary along the boundary of the template core significantly if this immediate neighborhood has significant variation. Extended template core features can be compared and a metric for the similarity calculated. The similarity is extracted from within the extended template core region and between unknown candidates. The template cores can then be classified and according to this and the corrections propagated to within the classifications. Usually prototypical cores are selected based on environment so that flattening is minimized. After propagation of the corrections, however suitability at each placement is still determined.

Figure 9:
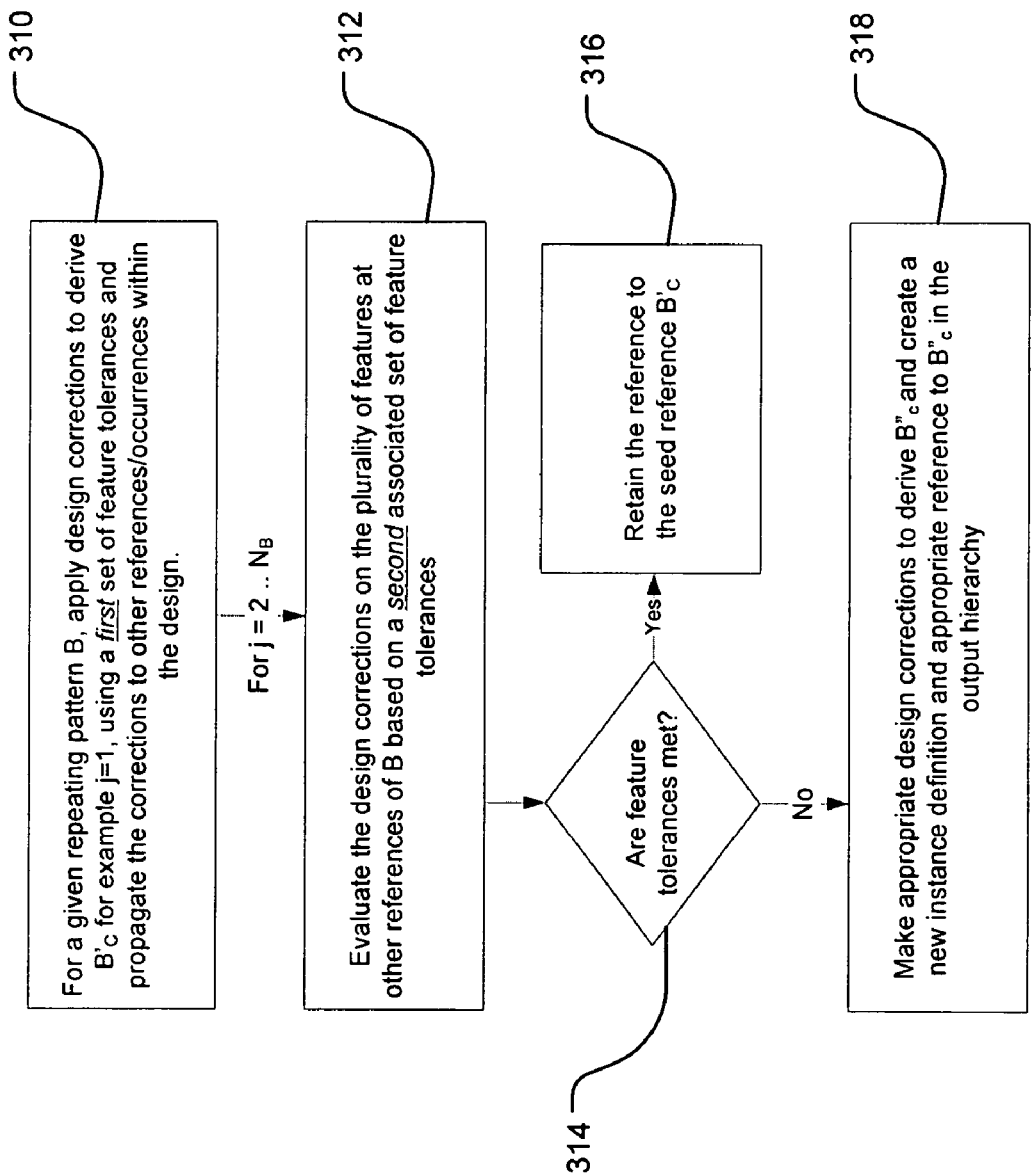
FIG. 9 is a flow diagram illustrating the method for modifying instances of a repeating pattern according to the present invention.

FIG. 9 is a process diagram illustrating the process for modifying instances of a repeating pattern in an integrated design according to the present invention.

Specifically, in step 310 for a given template core B, design corrections are applied to B for an example instance for an exemplary instantiation. Specifically, a first set of feature tolerances are determined. Often these feature tolerances are set forth based on the tightest tolerances required for the instantiation across the entire integrated circuit design.

These corrections are then propagated to the other instantiations of the repeating pattern and references within the integrated circuit design. Then, for each of these other instantiations, the design corrections are evaluated based on a second set of associated feature tolerances in step 314. Sometimes these are the tolerances associated with the various instantiations of the repeating pattern, especially if the pattern is located on a critical path, for example. In some cases, the tolerances for the repeating pattern will change between the various instantiations. In other instances, the location of the repeating patterns within the field, or features surrounding the repeating patterns will have a different impact on the rendering of those repeating patterns. Specifically, these factors may be used in evaluating the suitability of the initial correction in step 312. In a preferred embodiment, the evaluation of the suitability of the initial correction is achieved using a model based simulation where in the model predicts the process and optical effects of the rendering system.

In some embodiments, propagation of the corrections is prioritized based on the tolerances. Specifically, corrections are applied across the chip/field based on the first set of tolerances without consideration to position but considering environment and based on associated tolerances. The features with highest tolerances are corrected first without taking into account position dependent factors and generating new instances only if tolerances are not met. This is followed by corrections to the low tolerance features and making the additional corrections and generation of new instances as needed. This approach is generally described in U.S. patent application Ser. No. 10/860,852 filed on Jun. 4, 2004, which is incorporated herein in its entirety.

Figure 10:
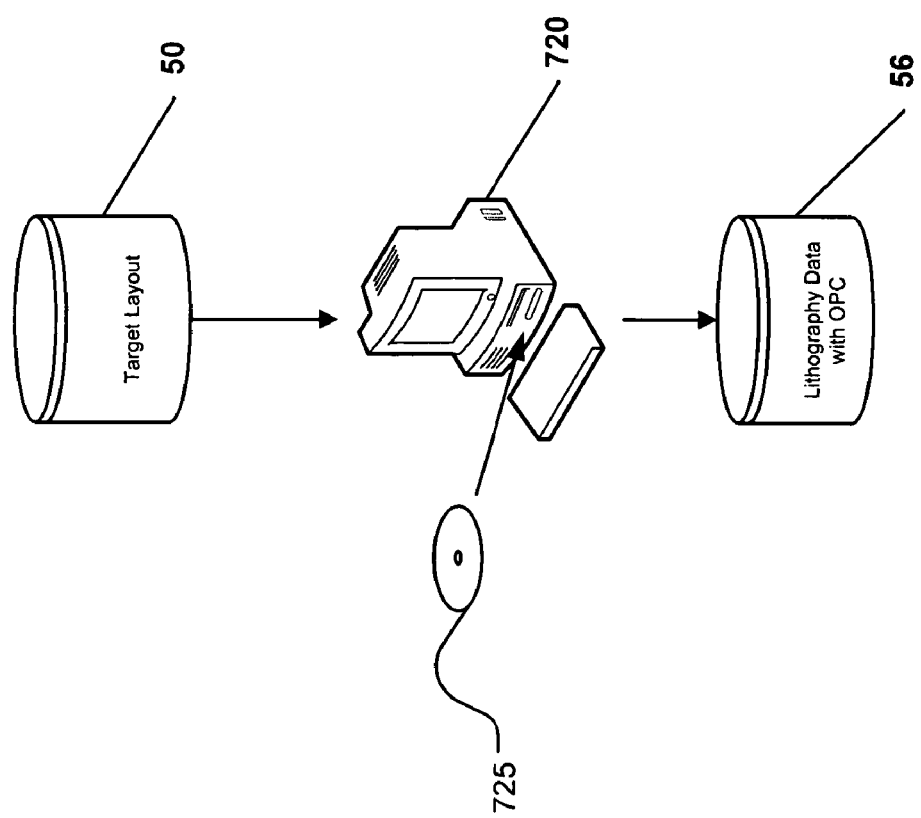
FIG. 10 illustrates a system for modifying instances of a repeating pattern and computer software product, according to the present invention.

FIG. 10 illustrates the typical manner in which the present invention is applied to the target data.

The target layout data 50 are stored in a data store such as a storage device or disk drive. The data are then accessed by a compute resource 720, such as a workstation computer. Often, this computer 720 is a multiprocessor/parallel processing computer or a distributed network of computers units. These types of computers are required because of the computationally intensive nature of OPC and other perturbation modeling and the size of the target data set.

The computer 720 receives a program implementing the inventive method for correcting position-dependent distortions in patterning of integrated circuits, such as on disk 725.

The resulting optical proximity corrected lithography data 56 are stored in a data storage device. Then, the data are appropriately fractured to a format acceptable to the writing tool and transmitted to and/or accessed by a mask writing tool, which then uses the fractured mask lithography data to generate the mask.

Alternatively, the lithography data are used to drive a direct-write device such as a lithography tool with a spatial light modulation system.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for modifying instances of a repeating pattern in an integrated circuit design to correct for perturbations during rendering, the method comprising:
    determining a correction for the repeating pattern based on a first set of tolerances for features of the repeating pattern;
    evaluating a suitability of the correction for instances of the repeating pattern in the integrated circuit design based on second set of tolerances, which is tighter than the first set of tolerances; and
    applying the correction to the instances of the repeating pattern if the correction is deemed suitable.

2. A method as claimed in claim 1, wherein:
    the step of applying the correction to the instances of the repeating pattern if the correction is deemed suitable includes creating a first set of corrected instances of the repeating pattern; and if the correction is deemed unsuitable, a different correction is applied to the instances of the repeating pattern to thereby create a second set of corrected instances of the repeating pattern.

3. A method as claimed in claim 1, wherein the step of determining the correction comprises determining changes to the repeating pattern in order to compensate for optical distortions.

4. A method as claimed in claim 1, wherein the step of determining the correction comprises determining changes to the repeating pattern in order to compensate for process distortions during the rendering.

5. A method as claimed in claim 1, wherein the first set of tolerances is determined to improve a likelihood that tolerances will be met for other instances of the repeating pattern.

6. A method as claimed in claim 5, wherein the second set of tolerances is determined based on a variation of dimensions of the features due to a maximum variation due to proximity effects.

7. A method as claimed in claim 1, wherein the step of evaluating the suitability of the correction for the instances is performed based on deviation in an environment of the instances.

8. A method as claimed in claim 1, wherein the step of evaluating the suitability of the correction for the instances includes simulating distortions from optical proximity effects at the instances.

9. A method as claimed in claim 1, wherein the step of evaluating the suitability of the correction for the instances is performed based on deviation in a field position of the instances.

10. A method as claimed in claim 1, wherein the step of evaluating the suitability of the correction for the instances is performed based on a diffraction radius of influence for the instances.

11. A method as claimed in claim 1, wherein the step of evaluating the suitability of the correction for the instances is performed based features within a region about the instances including 4 or less pitches of the integrated circuit design.

12. A method as claimed in claim 1, wherein the step of evaluating the suitability of the correction for the instances is performed by reference to zones within a field such that corrections are propagated to instances within the zones.

13. A method as claimed in claim 1, wherein the step of determining the correction comprises determining the correction for the repeating pattern for a zone within a field; and wherein the step of evaluating the suitability of the correction for instances is based on the second set of tolerances, which is associated with the instances.

14. A method as claimed in claim 1, wherein the perturbations include optical proximity effects.

15. A method as claimed in claim 1, wherein the perturbations include process effects.

16. A method for modifying instances of a repeating pattern in an integrated circuit design to correct for perturbations during rendering, the method comprising:
    determining a correction for the repeating pattern based on a first set of tolerances;
    evaluating a suitability of the correction for instances of the repeating pattern in the integrated circuit design based on a second set of tolerances, which is tighter than the first set of tolerances;
    applying the correction to the instances of the repeating pattern if the correction is deemed suitable to thereby create a first set of corrected instances of the repeating pattern; and
    if the correction is deemed unsuitable, applying a different correction to the instances of the repeating pattern to thereby create a second set of corrected instances of the repeating pattern.

17. A method as claimed in claim 16, wherein the first set of tolerances is determined to improve a likelihood that tolerances will be met for other instances of the repeating pattern.

18. A method as claimed in claim 17, wherein the second set of tolerances is determined based on a variation of dimensions of the features due to a maximum variation due to proximity effects.

19. A method as claimed in claim 16, wherein the step of determining the correction comprises determining changes to the repeating pattern in order to compensate for optical distortions.

20. A method as claimed in claim 16, wherein the step of determining the correction comprises determining changes to the repeating pattern in order to compensate for process distortions during the rendering.

21. A method as claimed in claim 16, wherein the step of evaluating the suitability of the correction for the instances is performed based on deviation in an environment of the instances.

22. A method as claimed in claim 16, wherein the step of evaluating the suitability of the correction for the instances includes simulating distortions from optical proximity effects at the instances.

23. A method as claimed in claim 16, wherein the step of evaluating the suitability of the correction for the instances is performed based on deviation in a field position of the instances.

24. A method as claimed in claim 16, wherein the step of evaluating the suitability of the correction for the instances is performed based on a diffraction radius of influence for the instances.

25. A method as claimed in claim 16, wherein the step of evaluating the suitability of the correction for the instances is performed based objects within a region about the instances including 4 or less pitches of the integrated circuit design.

26. A method as claimed in claim 16, wherein the step of evaluating the suitability of the correction for the instances is performed by reference to zones within a field such that corrections are propagated to instances within the zones.

27. A method as claimed in claim 16, wherein the step of determining the correction comprises determining the correction for the repeating pattern for a zone within a field; and wherein the step of evaluating the suitability of the correction for instances is based on the second set of tolerances, which is associated with the instances.

28. A method as claimed in claim 16, wherein the perturbations include optical proximity effects.

29. A method as claimed in claim 16, wherein the perturbations include process effects.

30. Computer-readable media on which a computer software product is stored, the software product for applying corrections to an integrated circuit design to compensate for perturbations occurring from rendering the integrated circuit design, the product comprising a computer-readable medium in which program instructions are stored, which instructions, when read by a computer, cause the computer to determine a correction for a repeating pattern in the integrated circuit design based on a first set of tolerances for features of the repeating pattern and then evaluate a suitability of the correction for instances of the repeating pattern in the integrated circuit design based on second set of tolerances, which is tighter than the first set of tolerances.

31. Computer-readable media as claimed in claim 30, wherein the instructions provide for the determination of the correction for the repeating pattern by determining changes to compensate for optical distortions during the rendering.

32. Computer-readable media as claimed in claim 30, wherein the instructions provide for the determination of the correction for the repeating pattern by determining changes to the repeating pattern in order to compensate for process distortions during the rendering.

33. Computer-readable media as claimed in claim 30, wherein the first set of tolerances is determined to improve a likelihood that tolerance will be met for other instances of the repeating pattern.

34. Computer-readable media as claimed in claim 30, wherein the second set of tolerances are determined based on a variation of dimensions of the features due to a maximum variation due to proximity effects.

35. Computer-readable media as claimed in claim 30, wherein the evaluation of the suitability of the corrections is performed based on a deviation in an environment of the instances.

36. Computer-readable media as claimed in claim 30, wherein the evaluation of the suitability of the corrections is performed based on a diffraction radius of influence for the instances.

37. Computer-readable media as claimed in claim 30, wherein the evaluation of the suitability of the corrections is performed by reference to zones within a field such that corrections are propagated to instances within the zones.

38. A system for modifying instances of a repeating pattern in an integrated circuit design, the system comprising:
a datastore storing the integrated circuit design; and
a compute resource that determines a correction for the repeating pattern based on a first set of tolerances for features of the repeating pattern and then evaluates a suitability of the correction for instances of the repeating pattern in the integrated circuit design based on second set of tolerances, which is tighter than the first set of tolerances.

39. A system as claimed in claim 38, wherein the compute resource determines the correction for the repeating pattern by determining changes to compensate for optical distortions during the rendering.

40. A system as claimed in claim 38, wherein the compute resource determines the correction for the repeating pattern by determining changes to the repeating pattern in order to compensate for process distortions during the rendering.

41. A system as claimed in claim 38, wherein the first set of tolerances is determined to improve a likelihood that tolerance will be met for other instances of the repeating pattern.

42. A system as claimed in claim 38, wherein the second set of tolerances are determined based on a variation of dimensions of the features due to a maximum variation due to proximity effects.

43. A system as claimed in claim 38, wherein the evaluation of the suitability of the corrections is performed based on deviation in an environment of the instances.

44. A system as claimed in claim 38, wherein the evaluation of the suitability of the corrections is performed based on a diffraction radius of influence for the instances.

45. A system as claimed in claim 38, wherein the evaluation of the suitability of the corrections is performed by reference to zones within a field such that corrections are propagated to instances within the zones.

46. A system for modifying instances of a repeating pattern in an integrated circuit design, the system comprising:
a datastore storing the integrated circuit design; and
a compute resource that determines a correction for the repeating pattern based on a first set of tolerances and then evaluates a suitability of the correction for instances of the repeating pattern in the integrated circuit design based on a second set of tolerances, which is tighter than the first set of tolerances, the correction is then applied to the instances of the repeating pattern if the correction is deemed suitable to thereby create a first set of corrected instances of the repeating pattern, and, if the correction is deemed unsuitable, a different correction is then applied to the instances of the repeating pattern to thereby create a second set of corrected instances of the repeating pattern.

47. A system as claimed in claim 46, wherein the compute resource determines the correction for the repeating pattern by determining changes to compensate for optical distortions during the rendering.

48. A system as claimed in claim 46, wherein the compute resource determines the correction for the repeating pattern by determining changes to the repeating pattern in order to compensate for process distortions during the rendering.

49. A system as claimed in claim 46, wherein the set of tolerances are determined based on a variation of dimensions of the features due to a maximum variation due to proximity effects.

50. A system as claimed in claim 46, wherein the evaluation of the suitability of the corrections is performed based on a deviation in an environment of the instances.

51. A system as claimed in claim 46, wherein the evaluation of the suitability of the corrections is performed based on a diffraction radius of influence for the instances.

52. A system as claimed in claim 46, wherein the evaluation of the suitability of the corrections is performed by reference to zones within a field such that corrections are propagated to instances within the zones.

* * * * *